United States Patent
Hsiao et al.

(10) Patent No.: US 10,436,391 B2
(45) Date of Patent: Oct. 8, 2019

(54) LIGHTING DEVICE, LUMINAIRE AND MANUFACTURING METHOD

(71) Applicant: SIGNIFY HOLDING B.V., Eindhoven (NL)

(72) Inventors: Ya-Kuang Hsiao, Eindhoven (NL); Chanjuan Wu, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/316,396

(22) PCT Filed: May 20, 2015

(86) PCT No.: PCT/EP2015/061157
§ 371 (c)(1),
(2) Date: Dec. 5, 2016

(87) PCT Pub. No.: WO2015/185360
PCT Pub. Date: Dec. 10, 2015

(65) Prior Publication Data
US 2017/0167663 A1    Jun. 15, 2017

(30) Foreign Application Priority Data

Jun. 5, 2014 (WO) ................ PCT/CN2014/079239
Aug. 25, 2014 (EP) .................................... 14182079

(51) Int. Cl.
*F21K 9/237* (2016.01)
*F21K 9/232* (2016.01)
(Continued)

(52) U.S. Cl.
CPC .............. *F21K 9/232* (2016.08); *F21K 9/237* (2016.08); *F21K 9/90* (2013.01); *F21S 4/24* (2016.01);
(Continued)

(58) Field of Classification Search
CPC .. F21K 9/232; F21K 9/237; F21K 9/90; F21S 4/24; F21S 4/22; F21V 3/00; F21V 21/14;
(Continued)

(56) References Cited

U.S. PATENT DOCUMENTS 6,709,132 B2    3/2004  Ishibashi
9,557,015 B2 *  1/2017  Boomgaarden ......... F21K 9/238
(Continued)

FOREIGN PATENT DOCUMENTS

CN    102767700 A    11/2012
EP    2314913 A1    4/2011
(Continued)

*Primary Examiner* — Y M. Lee
(74) *Attorney, Agent, or Firm* — Akarsh P. Belagodu

(57) ABSTRACT

Disclosed is a lighting device (100) comprising a plurality of solid state lighting (SSL) elements (20) such as LEDs that can be manufactured in a cost-effective manner and that emulates the appearance of an incandescent lighting device. The lighting device has a luminous arrangement comprising opposing tubular portions (12, 14) in between which strip-shaped portions (16) that carry the SSL elements radially extend. The luminous arrangement is mounted on a support structure (30) fitted inside a transmissive body (1 10) of the lighting device. A luminaire including the lighting device, a method of manufacturing the luminous arrangement and a method of manufacturing the lighting device are also disclosed.

12 Claims, 15 Drawing Sheets

(51) Int. Cl.
*F21K 9/90* (2016.01)
*F21S 4/24* (2016.01)
*F21V 3/00* (2015.01)
*F21V 21/14* (2006.01)
*H05K 1/18* (2006.01)
*F21S 4/22* (2016.01)
*F21Y 105/12* (2016.01)
*F21Y 105/10* (2016.01)
*F21Y 115/10* (2016.01)
*F21Y 107/30* (2016.01)
*F21Y 107/70* (2016.01)
*F21V 3/02* (2006.01)

(52) U.S. Cl.
CPC ............... *F21V 3/00* (2013.01); *F21V 21/14* (2013.01); *F21S 4/22* (2016.01); *F21V 3/02* (2013.01); *F21Y 2105/10* (2016.08); *F21Y 2105/12* (2016.08); *F21Y 2107/30* (2016.08); *F21Y 2107/70* (2016.08); *F21Y 2115/10* (2016.08); *H05K 1/189* (2013.01); *H05K 2201/10106* (2013.01)

(58) Field of Classification Search
CPC ............ F21V 2105/12; F21Y 2107/30; F21Y 2107/70; H05K 1/189; H05K 2201/10106; H05Y 2105/10
See application file for complete search history.

(56) References Cited

U.S. PATENT DOCUMENTS

| | | |
|---|---|---|
| 2010/0265711 A1 | 10/2010 | Lee |
| 2014/0049164 A1 | 2/2014 | McGuire et al. |
| 2014/0049971 A1 | 2/2014 | McGuire et al. |
| 2015/0049478 A1 | 2/2015 | Boomgaarden et al. |

FOREIGN PATENT DOCUMENTS

| | | |
|---|---|---|
| EP | 2339223 A1 | 6/2011 |
| GB | 2479758 A | 10/2011 |
| GB | 2484152 A | 4/2012 |
| JP | 2012142277 A | 7/2012 |
| JP | 2013065529 A | 4/2013 |
| JP | 2013179018 A1 | 9/2013 |
| JP | 2014511132 A | 5/2014 |
| WO | WO2011072465 A1 | 6/2011 |
| WO | WO2013078180 A1 | 5/2013 |

\* cited by examiner

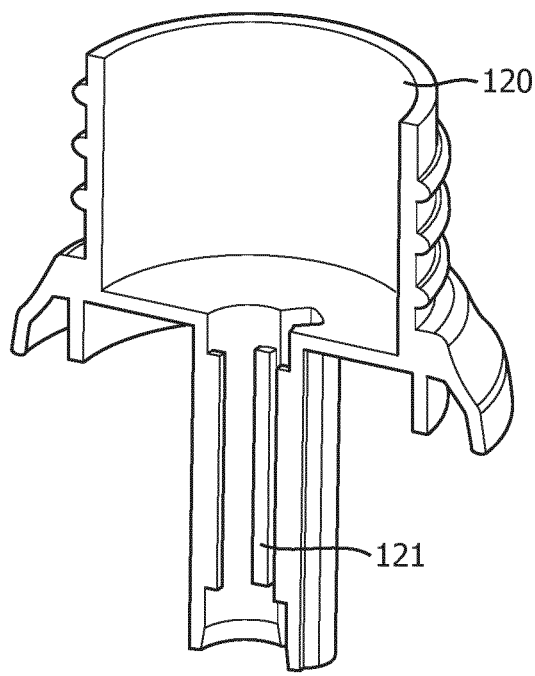
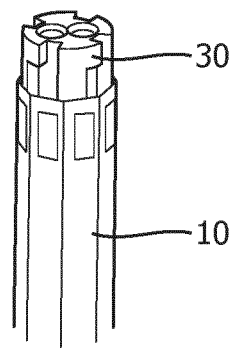
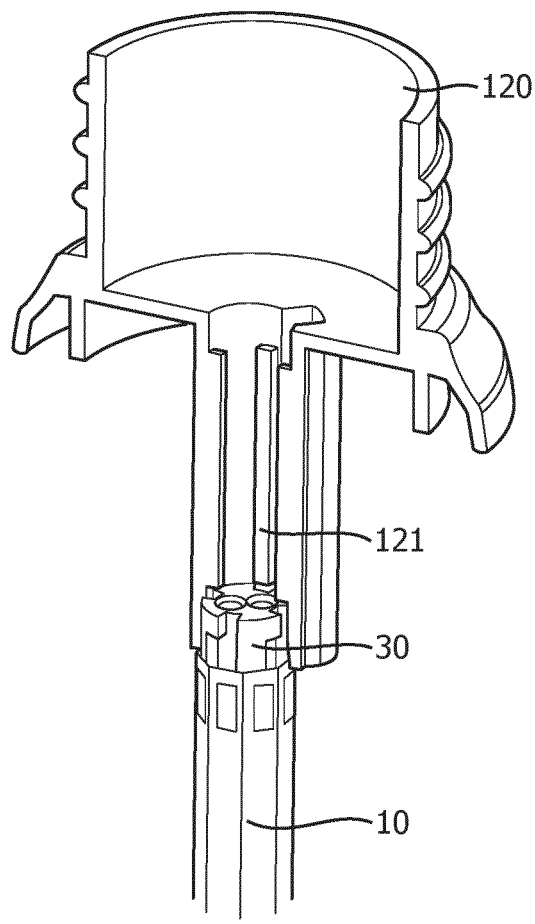
FIG. 14　　　　　FIG. 15 the benefit of European Patent Application No. 14182079.5, filed on AUG. 25, 2014 and Chinese Patent Application No. PCT/CN2014/079239, filed JUN. 5, 2014. These applications are hereby incorporated by reference herein.

LIGHTING DEVICE, LUMINAIRE AND MANUFACTURING METHOD

CROSS-REFERENCE TO PRIOR APPLICATIONS

This application is the U.S. National Phase application under 35 U.S.C. § 371 of International Application No. PCT/EP2015/061157, filed on MAY 20, 2015, which claims the benefit of European Patent Application No. 14182079.5, filed on AUG. 25, 2014 and Chinese Patent Application No. PCT/CN2014/079239, filed JUN. 5, 2014. These applications are hereby incorporated by reference herein.

FIELD OF THE INVENTION

The present invention relates to a lighting device comprising a transmissive body housing a luminous arrangement, said luminous arrangement comprising a single piece flexible carrier mounted on a support structure, the flexible carrier comprising a first terminal portion around a first region of the support structure and a plurality of strip-shaped portions radially extending from the first terminal portion.

The present invention further relates to a luminaire comprising such a lighting device.

The present invention yet further relates to a method of manufacturing a luminous arrangement for such a lighting device.

The present invention yet further relates to a method of manufacturing a lighting device including such a luminous arrangement.

BACKGROUND OF THE INVENTION

With a continuously growing population, it is becoming increasingly difficult to meet the world's energy needs as well as to kerb greenhouse gas emissions such as carbon dioxide emissions that are considered responsible for global warming phenomena. These concerns have triggered a drive towards more efficient electricity use in an attempt to reduce energy consumption.

One such area of concern is lighting applications, either in domestic or commercial settings. There is a clear trend towards the replacement of traditional incandescent light bulbs, which are notoriously power hungry, with more energy efficient replacements. Indeed, in many jurisdictions the production and retailing of incandescent light bulbs has been outlawed, thus forcing consumers to buy energy-efficient alternatives, e.g. when replacing incandescent light bulbs.

A particular promising alternative is provided by lighting devices including solid state lighting (SSL) elements, which can produce a unit luminous output at a fraction of the energy cost of incandescent light bulbs. An example of such a SSL element is a light emitting diode.

A problem hampering the penetration of the consumer markets by such lighting devices is that consumers are used to the appearance of incandescent lighting devices such as incandescent light bulbs, and as such expect the appearance of the replacement device to closely match this appearance. This is far from trivial when using SSL elements, as such elements can be considered to act as point light sources producing a directional luminous output. This is distinctly different to the glowing filament of an incandescent light source, which tend to produce an unidirectional luminous distribution.

Many design efforts of SSL element-based lighting devices have therefore focused on emulating the appearance of their incandescent equivalents. This however typically increases the cost of the SSL element-based alternative, which is also problematic given that even the simplest SSL element-based lighting devices are several times more expensive than their incandescent alternatives, and the high purchasing cost of these SSL element-based lighting devices also hampers significant market penetration.

For instance, U.S. Pat. No. 6,709,132 B2 discloses a LED bulb that emulates the appearance of a tungsten filament-based light bulb by including a flexible printed circuit board having a plurality of branches that are combined into a cage. The branches carry LEDs and each extend from a central aperture at a proximal end and have a hole at their distal ends, which the holes of respective branches are aligned in an overlay fashion such that a supporting rod is extended through the proximal central aperture and the distal overlaying holes when assembling the bulb. This however is a time-consuming process that is difficult to automate, as the distal apertures of the branches must be superimposed on each other to receive the supporting rod. This increases the cost of the LED bulb.

EP2314913A1 discloses a carrier for at least one light emitting unit comprises a mounting frame with mounting arms which are bent into a cage-like shape. However, such a mounting frame is formed before assembling into a cover. The outline of the cage-like mounting frame has to be smaller than the entry of the cover so that it can be inserted into the cover.

SUMMARY OF THE INVENTION

The present invention seeks to provide a more economical lighting device that emulates the appearance of an incandescent alternative.

The present invention further seeks to provide a luminaire including such a lighting device.

The present invention yet further seeks to provide a method of manufacturing a luminous arrangement of such a lighting device.

The present invention yet further seeks to provide a method of manufacturing a lighting device including such a luminous arrangement.

According to an aspect, there is provided a lighting device comprising a transmissive body housing a luminous arrangement, and a fitting cooperating with the transmissive housing, said luminous arrangement comprising a single piece flexible carrier mounted on a support structure, wherein the support structure is mounted inside the fitting to form a support assembly; the flexible carrier comprising a first tubular end portion enveloping a first region of the support structure; a second tubular end portion enveloping a second region of the support structure, the first region being spatially separated from the second region; and a plurality of strip-shaped portions radially extending from the first tubular end portion to the second tubular end portion, each of said strip-shaped portions carrying a plurality of solid state lighting (SSL) elements. The support assembly comprises a sub-assembly for forcing the first tubular end portion towards the second tubular end portion, such that the strip-shaped portions are forced to radially extend between the first tubular end portion and the second tubular end portion, after or during mounting the support assembly into the transmissive housing.

Preferably, the sub-assembly may comprise a resilient member (37), a motor, an electromagnet, or other structures allowing the first tubular end portion and the second tubular end portion moving towards each other.

The transmissive body may be a bulbous body, for instance when the lighting device is a light bulb. The overall diameter of the bulbous body is normally bigger than that of its entry. When the strip-shaped portions are radially deformed and if the luminous arrangement is extended to a size similar to the entry diameter or bigger, before mounting the support assembly into the transmissive housing, there could be much difficulty in the assembly procedure, or such assembly procedure will become impossible. Therefore, this sub-assembly facilitates the deformation of the luminous arrangement within the bulb in a particularly efficient manner, and enables the efficient assembling of the lighting device.

Because both ends of the strip-shaped portions are attached to common tubular portions, there is no need to individually align the strip-shaped portions when assembling the lighting device as the support structure can be simply inserted through the tubular portions. Consequently, the cost of the lighting device can be reduced without affecting the appearance of the lighting device.

In an embodiment, each of the strip-shaped portions extends from the first tubular end portion to the second tubular end portion in a meridian-like fashion.

In an alternative embodiment, each of the strip-shaped portions spirals from the first tubular end portion to the second tubular end portion. This has the technical advantage that the SSL elements are not vertically aligned in the lighting device, for which it has surprisingly been found that this improves the dissipation of the heat produced by the SSL elements.

The different strip-like portions have different distributions of solid state lighting elements to tune the appearance of the lighting device, e.g. different numbers of SSL elements and/or different colour-producing SSL elements, e.g. to tune the colour or colour temperature of the lighting device.

The support structure may be a tubular body having any suitable cross-sectional shape. For instance, the support structure may be a cylindrical structure for ease of manufacturing.

In an embodiment, the lighting device further comprises at least one driver circuit for driving the solid state lighting elements, wherein the solid state lighting elements on said strip-shaped portions are connected in series with said at least one driver circuit.

In an alternative embodiment, the lighting device further comprises at least one driver circuit for driving the solid state lighting elements, wherein the solid state lighting elements on different strip-shaped portions are connected in parallel with said at least one driver circuit.

In accordance with another aspect, there is provided a luminaire comprising the lighting device according to an embodiment of the present invention. Such a luminaire may for instance be a holder of the lighting device or an apparatus into which the lighting device is integrated.

In accordance with yet another aspect, there is provided a method of manufacturing a luminous arrangement, comprising providing a sheet of a flexible carrier; making a plurality of incisions in the flexible carrier, each incision extending between a first edge of a first terminal portion of the flexible carrier delimited by said first edge and an opposing second edge and a first further edge of a second terminal portion of the flexible carrier delimited by said first further edge and a second further edge opposite the first further edge to define a plurality of strip-shaped portions extending between said first terminal portion and said second terminal portion; mounting solid state lighting elements on each of the strip-shaped portions; and rolling the flexible carrier into a tubular shape, wherein the first terminal portion defines a first tubular end portion and the second terminal portion defines a second tubular end portion. Such a luminous arrangement can be manufactured in a straightforward manner and can be easily deformed into a luminous arrangement having radially extending strip-shaped portions, thus facilitating automated and cost-effective assembly of the luminous arrangement on a support structure in a lighting device.

In an embodiment, the method further comprises forcing the first tubular end portion towards the second tubular end portion such that the strip-shaped portions are forced to radially extend between the first tubular end portion and the second tubular end portion. This may be achieved prior to or after mounting the luminous arrangement on a support structure such as a support rod.

The flexible carrier may have a rectangular shape wherein said incisions extend in parallel with a side edge of said rectangular shape such that the deformed luminous arrangement comprises strip-shape portions radially extending between the opposing tubular end portions in a meridian-like fashion.

Alternatively, at least a central section of the flexible carrier may have a parallelogram shape wherein said incisions extend in parallel with a side edge of said parallelogram shape such that the deformed luminous arrangement comprises strip-shape portions spiralling between the opposing tubular end portions. This yields a luminous arrangement having particularly favourable thermal characteristics.

In accordance with yet another aspect, there is provided a method of manufacturing a lighting device, the method comprising manufacturing a luminous arrangement in accordance with an embodiment of the aforementioned method, mounting the luminous arrangement on a support structure such that the first tubular end portion envelopes a first region of the support structure and the second tubular end portion envelopes a second region of the support structure, the first region being spatially separated from the second region; providing a transmissive housing and a fitting for cooperating with the transmissive housing;

mounting the support structure inside the fitting to form a support assembly; mounting the support assembly in the transmissive housing such that the luminous arrangement is enclosed by the transmissive housing; and forcing the first tubular end portion towards the second tubular end portion such that the strip-shaped portions are forced to radially extend between the first tubular end portion and the second tubular end portion after or during mounting the support assembly into the transmissive housing. This method facilitates a particular cost-effective manufacturing method of a lighting device such as a light bulb having an appearance that closely resembles the appearance of an incandescent alternative.

Preferably, the luminous arrangement is deformed into a bulb-shaped filament-like arrangement after or during insertion of the support assembly into the transmissive housing.

In an embodiment, the support structure comprises a distal securing member; a main body coupled to the distal securing member; an annular recess in the distal securing member and delimited by the main body, a distal end portion of the flexible carrier being secured in said annular recess; and a protrusion extending from the main body opposite said distal securing member, wherein the step of forcing the first tubular end portion towards the second tubular end portion is performed after mounting the support assembly into the transmissive housing; and the step of forcing the first tubular end portion towards the second tubular end portion such that the strip-shaped portions are forced to radially extend between the first tubular end portion and the second tubular end portion comprises using the protrusion to pull the main body into the fitting whilst retaining the proximal end portion of the flexible carrier, thereby forcing the distal end portion and the proximal end portion of the flexible carrier towards each other. Alternatively, during the step of mounting the support assembly into the transmissive housing on the fitting such that the luminous arrangement is enclosed by the transmissive housing, the distal securing member is pushed against an inner wall of the transmissive housing, thereby forcing the distal end portion and the proximal end portion of the flexible carrier towards each other. This facilitates the deformation of the luminous arrangement within the bulb in a particularly efficient manner.

The step of providing said fitting may comprise providing a fitting including a receiving member for receiving the proximal end of the support structure, said receiving member including a stepped inner wall profile for immobilizing a proximal end portion of the flexible carrier during said deformation step. Such a fitting helps securing the luminous arrangement during the deformation step.

In another embodiment, the support structure comprises a hollow tubular body; a sealing member integral to the hollow tubular body and dimensioned to seal off the transmissive housing; a resilient member compressed against the sealing member; and a proximal securing member slidably fitted around the support structure such that the resilient member is clamped in between the sealing member and the proximal securing member; and wherein the step of forcing the first tubular end portion towards the second tubular end portion is performed after mounting the support assembly into the transmissive housing;

and the step of forcing the first tubular end portion towards the second tubular end portion such that the strip-shaped portions are forced to radially extend between the first tubular end portion and the second tubular end portion comprises releasing said resilient member such that the proximal securing member is forced towards a distal end of the support structure. This facilitates the deformation of the luminous arrangement within the bulb in a particularly efficient manner.

The method may further comprise fusing the sealing member with an edge portion of the transmissive housing to form a gas-tight inner volume within the transmissive housing. This allows for the lighting device to be filled with a desired gas or gas mixture.

BRIEF DESCRIPTION OF THE DRAWINGS

Embodiments of the invention are described in more detail and by way of non-limiting examples with reference to the accompanying drawings, wherein:

FIGS. 12-19 schematically depict various aspects of a method of manufacturing a luminous arrangement and lighting device according to yet another embodiment.

DETAILED DESCRIPTION OF THE EMBODIMENTS

Figure 1:
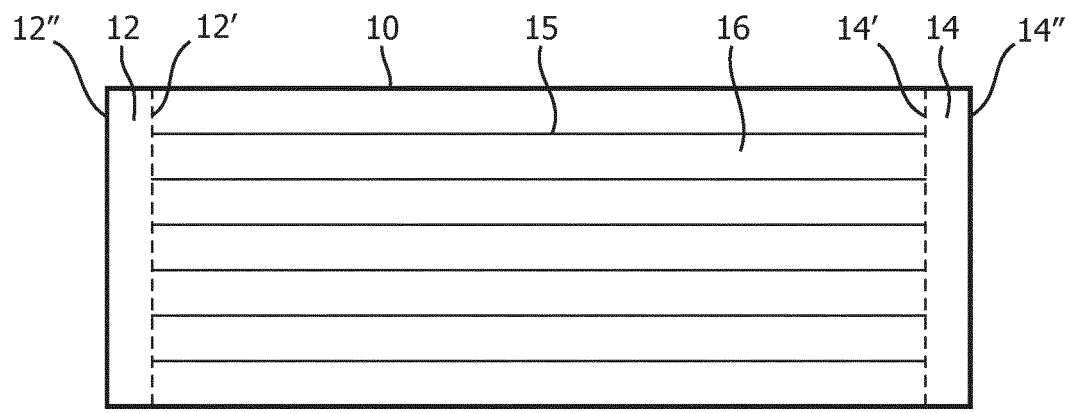
FIGS. 1-4 schematically depict various steps of a method of manufacturing a luminous arrangement and lighting device according to an embodiment.

It should be understood that the Figures are merely schematic and are not drawn to scale. It should also be understood that the same reference numerals are used throughout the Figures to indicate the same or similar parts.

FIGS. 1-4 schematically depict a method of manufacturing a luminous arrangement in accordance with an embodiment. The method begins as shown in FIG. 1 with the provision of a flexible carrier 10, such as a flexible printed circuit board. Such a flexible printed circuit board may for instance comprise of a sandwich structure in which a conductive layer such as a metal layer, e.g. a copper layer, is sandwiched in between flexible polymer layers that are electrically insulating. For instance, a suitable polymer for such purposes is polyimide although the skilled person will be aware of other suitable polymers for this purpose, such as PEEK or polyester. It should furthermore be understood that the flexible carrier 10 does not need to be a sandwich structure in which the conductive material is already present; it is equally feasible to provide a flexible carrier such as a flexible polymer onto which a conductive pattern is formed using a suitable deposition technique such as screen printing or any other suitable printing technique. It is for instance well-known to form a flexible printed circuit boards by printing silver tracks onto a PEEK polymer carrier. Other combinations of printing conductive materials onto electrically insulating polymer carriers will be apparent to the skilled person.

Next, a plurality of incisions or cuts 15 are made in the flexible carrier 10, which incisions or cuts 15 typically are made in parallel with a side edge of the flexible carrier 10, thereby forming a plurality of strip-shaped portions 16 in the flexible carrier 10. Importantly, the incisions or cuts 15 do not extend over the full length of the flexible carrier 10. Instead, the incisions or cuts 15 are made such that terminal portions of the flexible carrier 10 are defined that delimit the incisions or cuts 15. Specifically, a first terminal portion 12 is formed at a first end of the flexible carrier 10, which first terminal portion 12 has an inner edge 12' at which the incisions or cuts 15 terminate and an outer edge 12" opposite the inner edge 12' that coincides with the outer edge of the flexible carrier 10. A second terminal portion 14 is formed at a second end of the flexible carrier 10 opposite the first end of the flexible carrier 10, which second terminal portion 14 has a further inner edge 14' at which the incisions or cuts 15 terminate and a further outer edge 14" opposite the inner edge 14' that coincides with a further outer edge of the flexible carrier 10 opposite its outer edge. The incisions or cuts 15 may be made in any suitable manner, e.g. by blade cutting, laser cutting, and so on.

Figure 2:
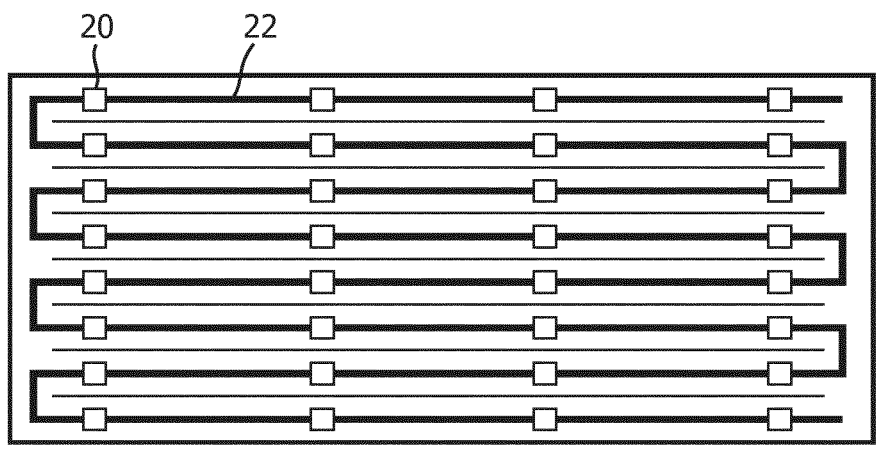

Next, as shown in FIG. 2 by way of non-limiting example, the conductive tracks 22 are formed on the flexible carrier 10 and the SSL elements 20 are mounted on the flexible tracks 20 such that the SSL elements 20 are located on the strip-shaped portions 16 of the flexible carrier 10. As already mentioned above, the conductive tracks 22 may be formed in any suitable manner, for instance by patterning a conductive material such as a copper film sandwiched in between polymer layers of the flexible carrier 10 or by depositing the desired conductive pattern on the flexible carrier 10 using a suitable deposition technique such as screen printing. The SSL elements 20 may be bonded to the conductive tracks 22 in any suitable manner, e.g. soldering, gluing using a conductive adhesive and so on. In addition to the SSL elements 20, further circuit elements (not shown) may be bonded to the conductive tracks 22. In the example embodiment, the conductive tracks 22 are formed following the formation of the cuts or incisions 15. However, it should be understood that it is equally feasible to form the conductive tracks 22 prior to forming the cuts or incisions 15.

As shown in FIG. 2, the SSL elements 20 are arranged on the strip-shaped portions 16 in a regular pattern such that each strip-shaped portion 16 carries the same pattern of SSL elements 20. However, it should be understood that this is by way of non-limiting example only and that it is equally feasible that different strip-shaped portions 16 carry different patterns of SSL elements 20, for instance different numbers of SSL elements 20 and/or SSL elements 20 in different locations compared to other strip-shaped portions 16. For instance, different patterns may be applied to achieve certain luminous distributions in case a non-uniform distribution is desirable.

The SSL elements 20 may be any suitable type of SSL element, such as a light emitting diode (LED). Any suitable type of LED may be used; for instance, the LED may include an organic or inorganic semiconductor layer. In case of an organic semiconductor layer, the organic material may be a polymer material or a small molecule material, and so on. The SSL elements 20 may be identical or may be different; for instance, different colour SSL elements 20 may be bonded to the strip-shaped portions 16 in order to tune the colour and/or colour point produced by a lighting device including the flexible carrier 10.

Figure 3:
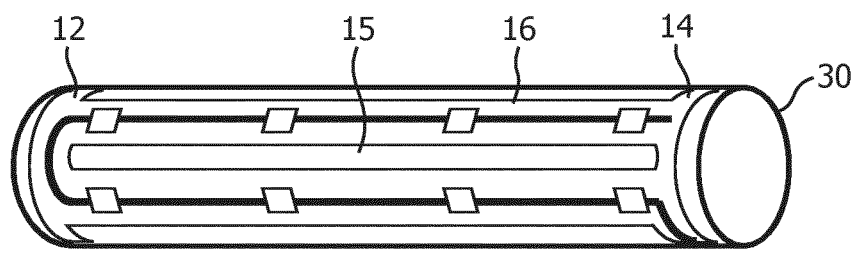

After the formation of the conductive tracks 22 and the bonding of the SSL elements 20 thereto, the flexible carrier 10 is rolled into a tubular shape, as shown in FIG. 3. To this end, the flexible carrier 10 may be rolled onto a support structure 30 such as a glass or metal support rod. The support structure 30 may be a solid structure or a tubular (hollow) structure. Alternatively, the flexible carrier may be rolled into a tubular shape without using such a support structure.

In the embodiment shown in FIG. 3, the flexible carrier 10 is rolled into a tubular shape having a circular cross-section although it should be understood that other shaped cross-sections are also feasible, e.g. oval or polygonal cross-sections. In order to achieve such non-circular cross-sections, the use of a support structure 30 may be necessary. The flexible carrier 10 may be fixated in this tubular shape in any suitable manner, for instance by applying a suitable adhesive in between overlapping portions of the flexible carrier 10. By rolling up the flexible carrier as shown in FIG. 3, the first terminal portion 12 and the second terminal portion 14 of the flexible carrier 10 have assumed a tubular shape, with the strip-shaped portions 16 extending between the tubular-shaped first terminal portion 12 and the tubular-shaped second terminal portion 14.

Figure 4:
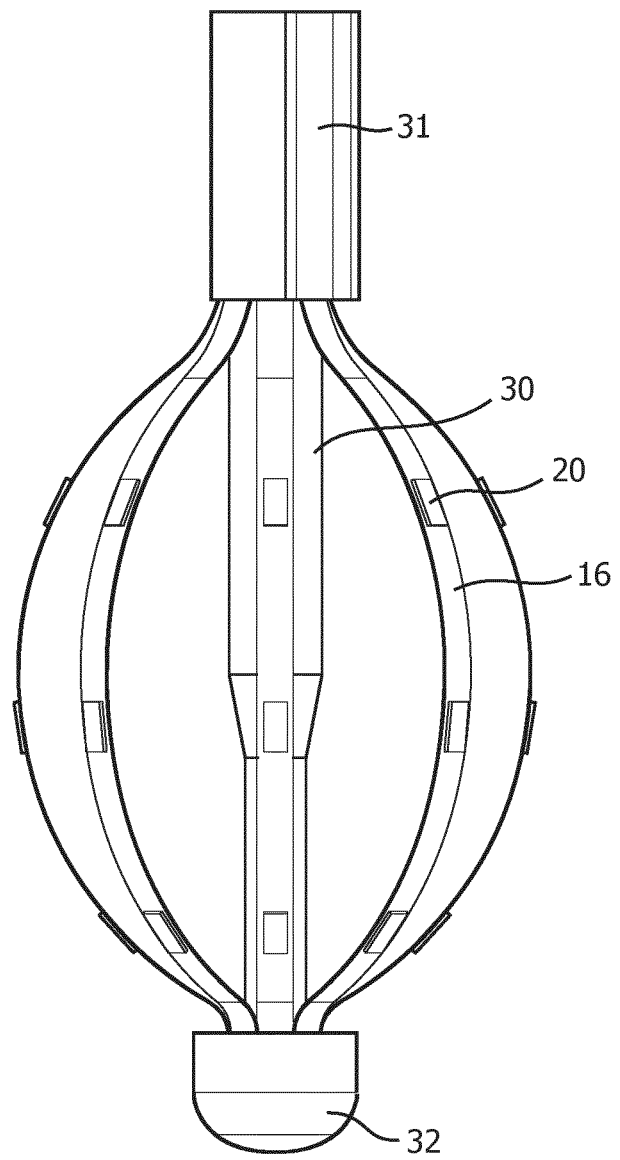

The thus obtained luminous arrangement is subsequently deformed into a lantern-like or globe-like structure as shown in FIG. 4. To this end, the first terminal portion 12 is forced towards the second terminal portion 14 (or vice versa) such that the strip-shaped portions 16 are forced out of the original plane of the flexible carrier 10, thereby forming strip-shaped portions 16 that radially extend from the first terminal portion 12 to the second terminal portion 14 of the flexible carrier 10. As shown in FIG. 4, this deformation step may be performed on the support structure 30, which is preferable because of the improved control over the deformation of the luminous arrangement. However, it should be understood that this deformation step may also be performed in the absence of the support structure 30, in which case the support structure 30 is inserted into the deformed luminous arrangement after the deformation step.

Once the luminous arrangement has a desired shape, the luminous arrangement may be secured on the support structure 30 such that the first terminal portion 12 of the flexible carrier 10 is secured in a first region of the support structure 30 and the second terminal portion 14 of the flexible carrier 10 is secured in a second region of the support structure 30, wherein the first region is spatially separated from the second region. The respective terminal portions of the flexible carrier 10 may be secured on the support structure 30 in any suitable manner, for instance by using a suitable adhesive or a suitable fixing means such as one or more pins, screws, nails or the like. Alternatively, the deformed flexible carrier may be secured by a first or proximal securing member 31 and a second or distal securing member 32 as shown in FIG. 4, which may respectively envelop the first terminal portion 12 and the second terminal portion 14.

Figure 5:
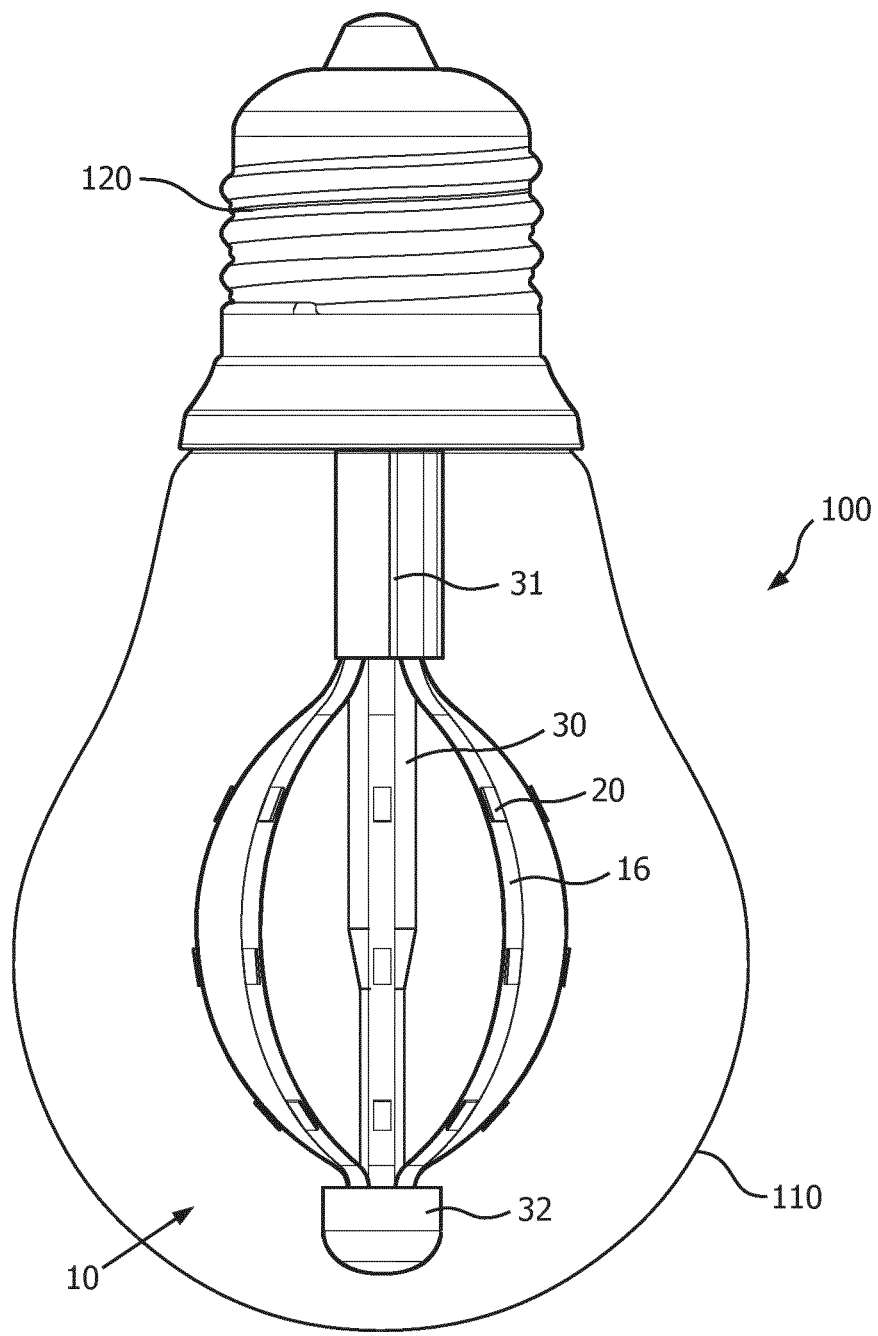
FIG. 5 schematically depicts a lighting device manufactured in accordance with the methods of FIGS. 1-4.

The thus obtained luminous arrangement including the deformed flexible carrier 10 may be used in a method of manufacturing a lighting device 100 as shown in FIG. 5. To this end, a transmissive body 110 is provided, which for instance may be a bulbous body made of any suitable light-transmissive material such as glass or a polymer such as polycarbonate (PC), polyethylene (PET) terephthalate, poly (methyl methacrylate) (PMMA) and so on. In addition, a fitting 120 is provided, which is designed to cooperate with the transmissive body 110 in such a manner that when engaged in such a corporation the transmissive body 110 and the fitting 120 define the housing of the lighting device 100. The fitting 120 typically includes electrically conductive terminals for connecting the lighting device 100 to a power supply. The fitting 120 may have any suitable shape. For instance, the fitting 120 may be a screw fitting (an E-type fitting), a bayonet fitting or a fitting including two or more pins such as a MR-type or GU-type fitting. Other suitable types of fittings will be immediately apparent to the skilled person.

The fitting 120 typically comprises a receptacle for receiving the support structure 30; in other words, the support structure 30 is typically mounted in the fitting 120 such that the deformed flexible carrier 10 on the support structure 30 is located inside the housing defined by the transmissive body 110 and the fitting 120, such that the SSL elements 20 on the strip-shaped portions 16 radially extending between the first tubular terminal portion 12 and the second tubular terminal portion 14 of the flexible carrier 10 produce the desired luminous distribution of the lighting device 100 when in use, such as a highly uniform luminous distribution closely resembling the luminous distribution of an equivalent incandescent lighting device. It is noted for the avoidance of doubt that in FIG. 5 the first tubular terminal portion 12 and the second tubular terminal portion 14 are obscured from direct view by the first securing member 31 and the second securing member 32 respectively.

The transmissive body 110 and the fitting 120 may be engaged in any suitable manner, for instance using an adhesive or a suitable locking mechanism. A non-limiting example of such a suitable locking mechanism may be provided if the transmissive body 110 is screwed into the fitting 120, e.g. using matching threads on an outer surface of the transmissive body and an inner surface of the fitting 120 respectively.

The fitting 120 may further house one or more driver circuits (not shown) of the SSL elements 20. In an embodiment, the conductive pattern 22 is such that the SSL elements 20 are connected in series to the driver circuit. In an alternative embodiment, each strip-shaped portion 16 is individually connected to such a driver circuit, such that the SSL elements 20 on the different strip-shaped portions 16 are connected in parallel. Other suitable connection types, such as a mixture of serially connected and parallel connected SSL elements 20, may also be contemplated.

In the embodiment shown in FIGS. 1-5, a rectangular flexible carrier 10 is used, which leads to a lighting device 100 in which the strip-shaped portions 16 radially extend between the first terminal portion 12 and the second terminal portion 14 in a meridian-like fashion. In other words, each strip-shaped portion 16 defines the shortest path between two points on a virtual globe-like structure, wherein the two points are the connection points of the strip-shaped portion 16 on the first terminal portion 12 and the second terminal portion 14 respectively. This may provide a lighting device 100 in which the strip-shaped portions 16 radially extend substantially vertically if the optical axis of the lighting device 100 that coincides with the support structure 30 is oriented along a vertical axis.

It has been found that by forcing the strip-shaped portions 16 to radially extend in a meridian fashion as shown in FIG. 5, the thermal management of the SSL elements 20 can be well-controlled. This is important because the SSL elements 20 are designed to operate within a certain temperature range, and exceeding the upper value of his range can reduce the lifetime of the SSL element 20 whilst at the same time causing the luminous output characteristics such as colour of the SSL element 22 change, such that it is highly desirable to ensure that the SSL elements 20 can be operated within the aforementioned temperature range. The placement of the SSL elements 20 on the radially extending strip-shaped portions 16 ensures that the SSL elements 20 are not in close vicinity to each other, which promotes effective heat transfer to the surroundings of the SSL elements 20.

However, it has surprisingly been found that the thermal management can be further improved by changing the meridian shape of the strip-shaped portions 16 to a spiral shape in accordance with an alternative embodiment. To this end, the aforementioned manufacturing method of the luminous arrangement may be adjusted as follows.

Figure 6:
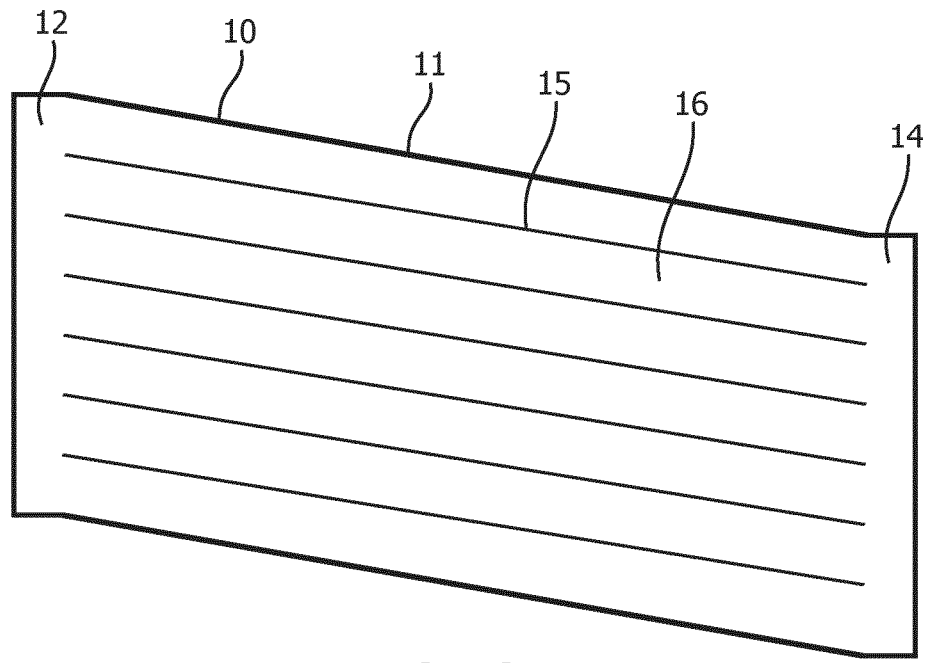
FIGS. 6-10 schematically depict various steps of a method of manufacturing a luminous arrangement and lighting device according to another embodiment.

As shown in FIG. 6, a flexible carrier 10 is provided having at least a central portion 11 shaped as a parallelogram, which central portion 11 is delimited by the first terminal portion 12 at one end and the second terminal portion 14 at the other end. The incisions or cuts 15 defining the strip-shaped portions 16 are made in this central portion 11 such that the incisions or cuts 15 extend between the respective inner edges of the first terminal portion 12 and the second terminal portion 14 as previously explained with the aid of FIG. 1. Each incision or cut 15 extends in parallel with the side edge of the parallelogram central portion 11, thereby providing a plurality of parallel incisions or cuts 15 that slant from the first terminal portion 12 to the second terminal portion 14 of the flexible carrier 10.

Figure 7:
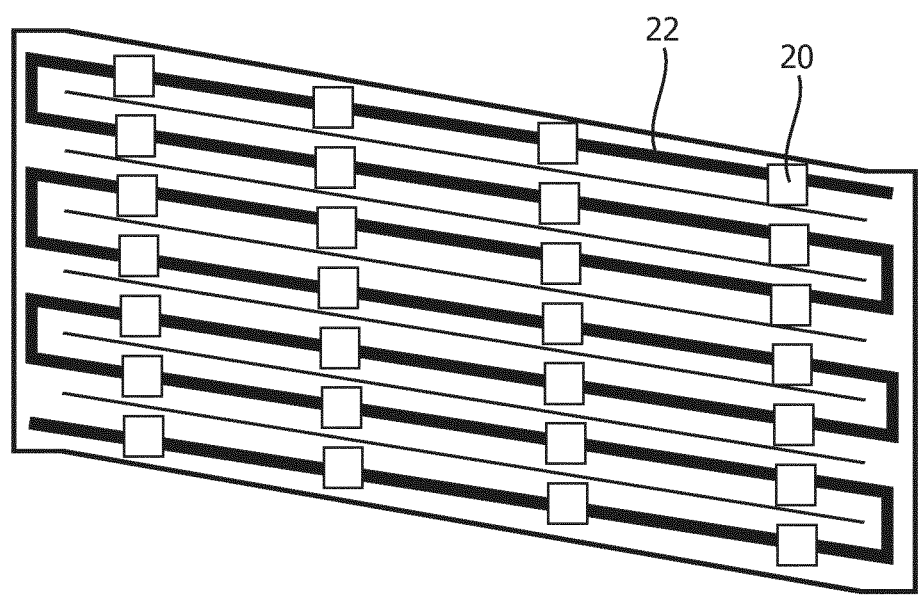

Next, as shown in FIG. 7, the conductive tracks 22 are formed and the SSL elements 20 are bonded as previously explained with the aid of FIG. 2, after which the flexible carrier 10 is rolled into a tubular shape as previously explained. The thus obtained luminous arrangement is subsequently deformed as previously explained, i.e. by forcing the first terminal portion 12 towards the second terminal portion 14 (or vice versa) to force the strip-shaped portions 16 out of the plane of the flexible carrier 10. As before, this deformation step may be performed after the flexible carrier 10 is rolled onto the support structure 30, or may be performed in the absence of the support structure 30.

Figure 8:
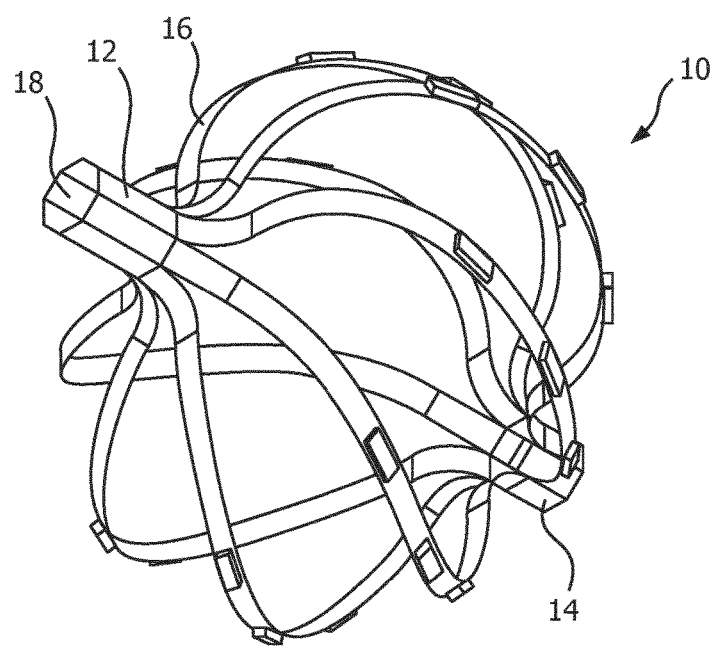
Figure 9:
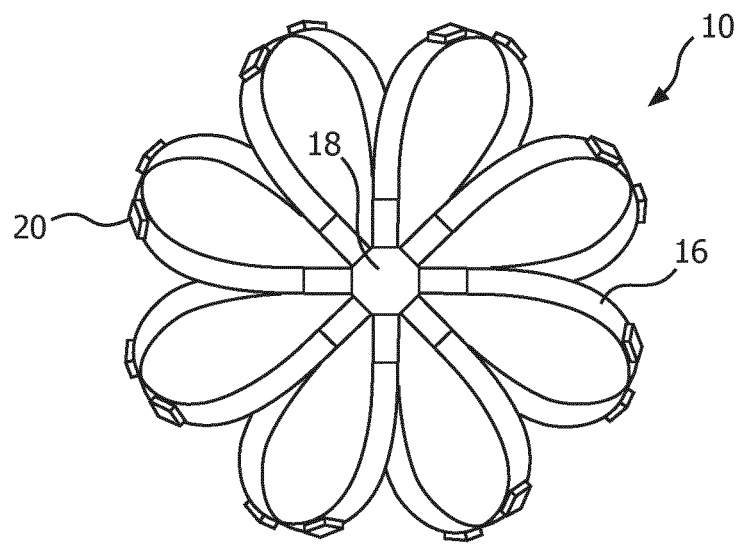
Figure 10:
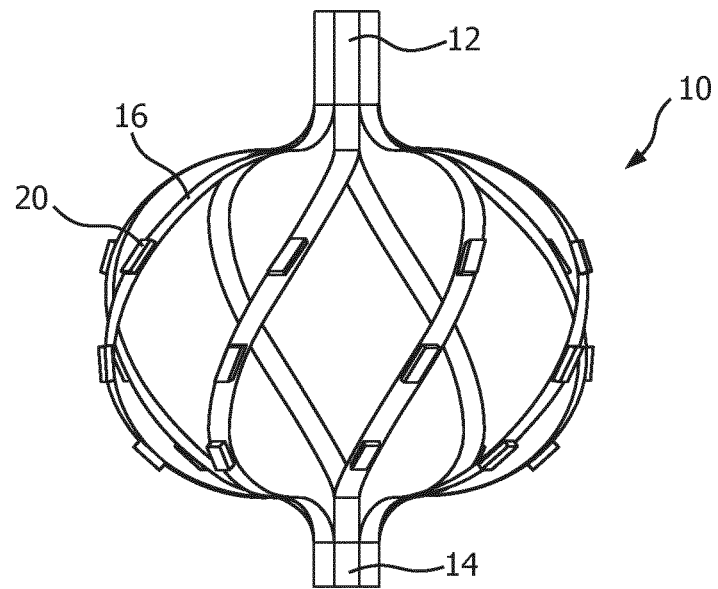
Figure 11:
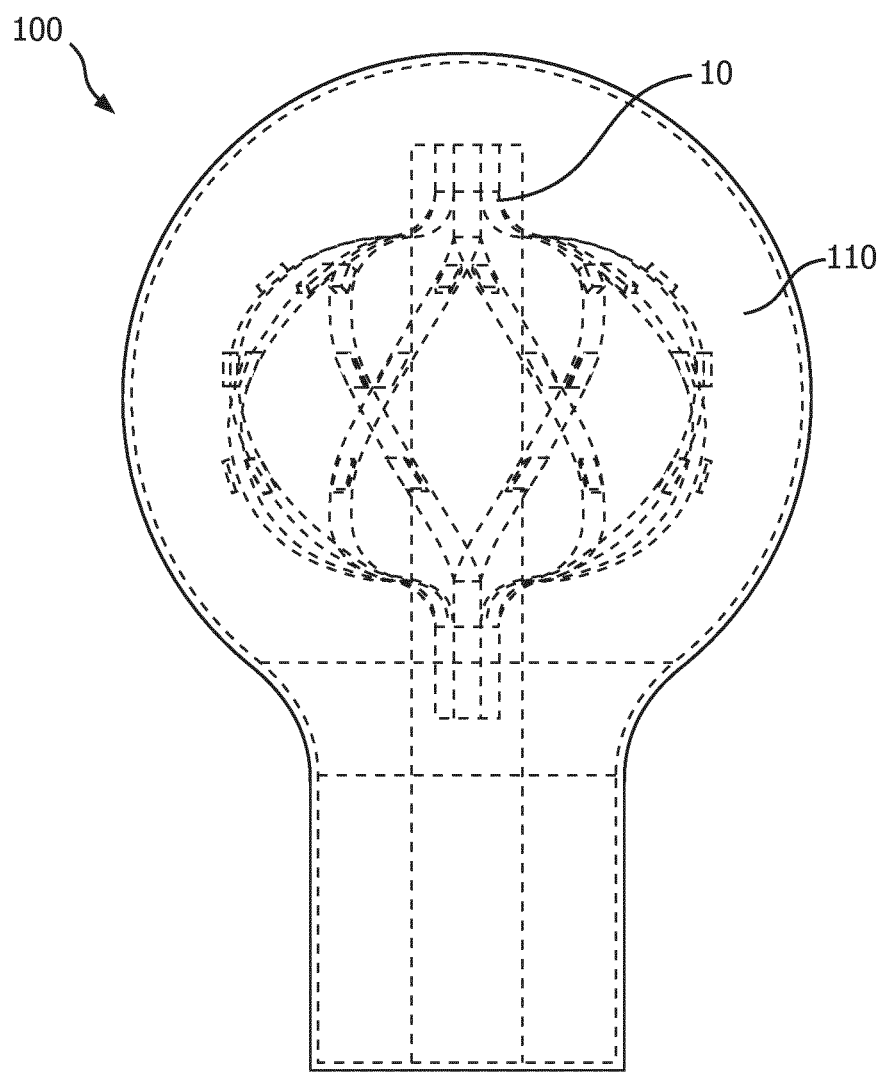
FIG. 11 schematically depicts a lighting device manufactured in accordance with the methods of FIGS. 6-10.

However, due to the parallelogram shape of the central portion 11 of the flexible carrier 10, the strip-shaped portions 16 are forced to spiral from the first tubular terminal portion 12 towards the second tubular terminal portion 14 of the flexible carrier 10. The thus obtained luminous arrangement is shown in perspective view in FIG. 8, whereas a top view of the thus obtained luminous arrangement is shown in FIG. 9 and a side view of the thus obtained luminous arrangement is shown in FIG. 10. As indicated by the aperture 18 in the first tubular terminal portion 12 of the flexible carrier 10, the luminous arrangement is shown in the absence of the support structure 30, but it should be understood that the support structure 30 may be present prior to the deformation of the flexible carrier 10 as previously explained. In FIGS. 8-10 the aperture 18 is polygonal aperture by way of non-limiting example. It is equally feasible that the aperture 18 has a circular or oval circumference, as previously explained.

As before, the luminous arrangement defined by the deformed flexible carrier 10 may be placed in a lighting device 100 including a transmissive body 110. As this is entirely analogous to the manufacturing method of the lighting device shown in FIG. 5, this will not be explained again for the sake of brevity only.

Figure 12:
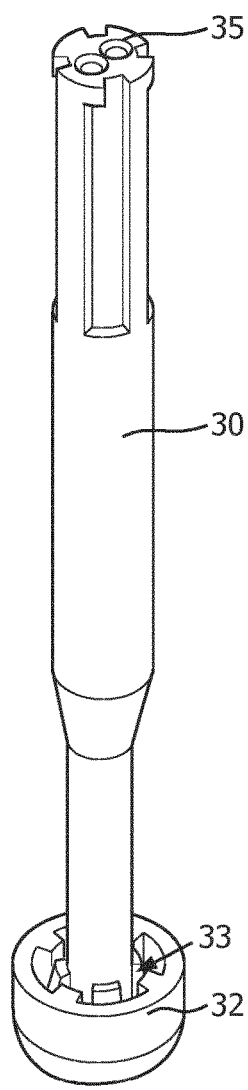
Figure 13:
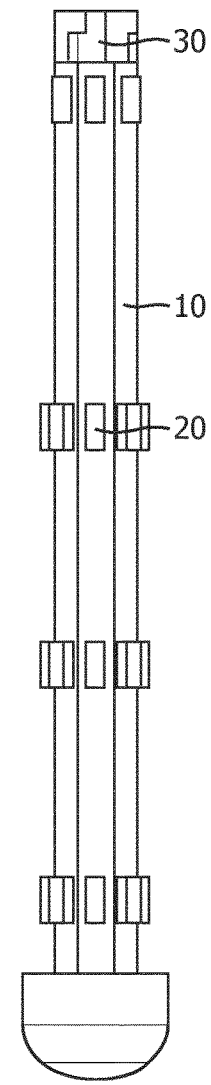

Another embodiment of a manufacturing method of a luminous arrangement 10 and lighting device 100 is depicted in FIGS. 12-19, which will be described in more detail below. A flexible carrier 10 carrying SSL elements 20 as previously described in for instance FIGS. 1 and 2 or in FIGS. 6 and 7 and their detailed descriptions may be provided. As shown in FIG. 12, a support structure 30, e.g. a tube or pin, is provided having a distal securing member 32, e.g. a cap, mounted on a main part of the support structure 30 for receiving the flexible carrier 10 as shown in FIG. 13. The support structure 30 may be made of any suitable material, such as a metal, glass or a plastics material. The distal securing member 32 further comprises an annular recess 33 around the main part for receiving an end portion of the flexible carrier 10, thereby immobilizing the end portion during the aforementioned deformation of the flexible carrier 10. In this embodiment, the support structure 30 does not comprise a proximal securing member; instead, the proximal securing function is provided by a separate member, e.g. a fitting, as will be explained in more detail below.

The support structure 30 may further comprise a protrusion such as a pin 35 extending from the main part of the support structure 30 opposite the distal securing member 32, which pin 35 is accessible, e.g. through a suitably shaped fitting, once the support structure 30 is mounted in a transmissive body 110.

As shown in FIG. 14, a fitting 120 may be provided including a receiving member 121 for receiving the proximal end of the support structure 30. The fitting 120 may be formed of any suitable material or combination of materials, as will be apparent to the skilled person. As shown in FIG. 15, the proximal end of the support structure 30 carrying the flexible carrier 10 is subsequently inserted into the receiving member 121 of the fitting 120 to form an assembly that may be inserted into a transmissive body of a lighting device.

Figures 16, 17:
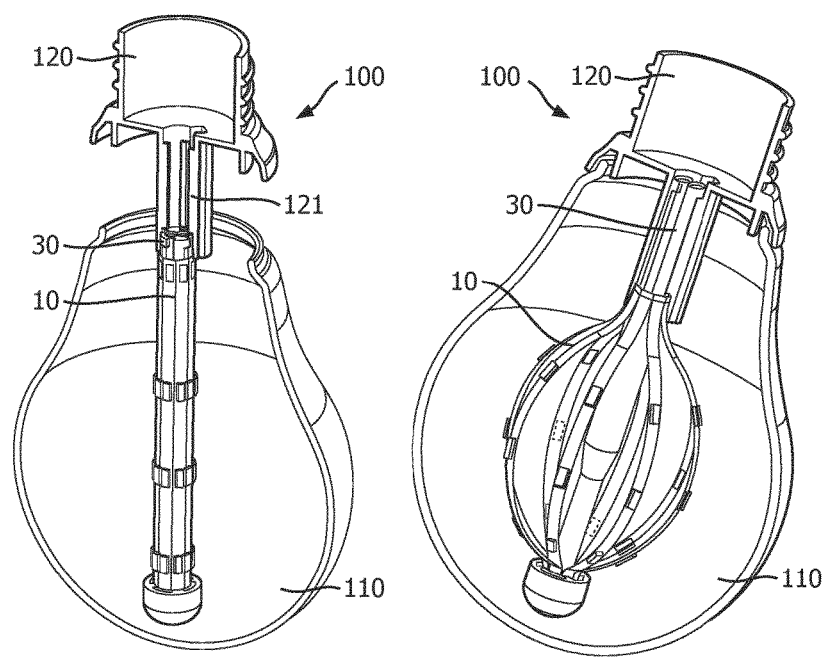

FIG. 16 schematically depicts the placement of such an assembly in a lighting device 100 comprising a transmissive body 110, which for instance may be a bulbous body made of any suitable light-transmissive material such as glass or a polymer such as polycarbonate (PC), polyethylene (PET) terephthalate, poly (methyl methacrylate) (PMMA) and so on as previously explained, after which the fitting 120 is secured on the transmissive body 110 in any suitable manner, e.g. by gluing, screw fitting, melting and so on as shown in FIG. 17.

Figure 18:
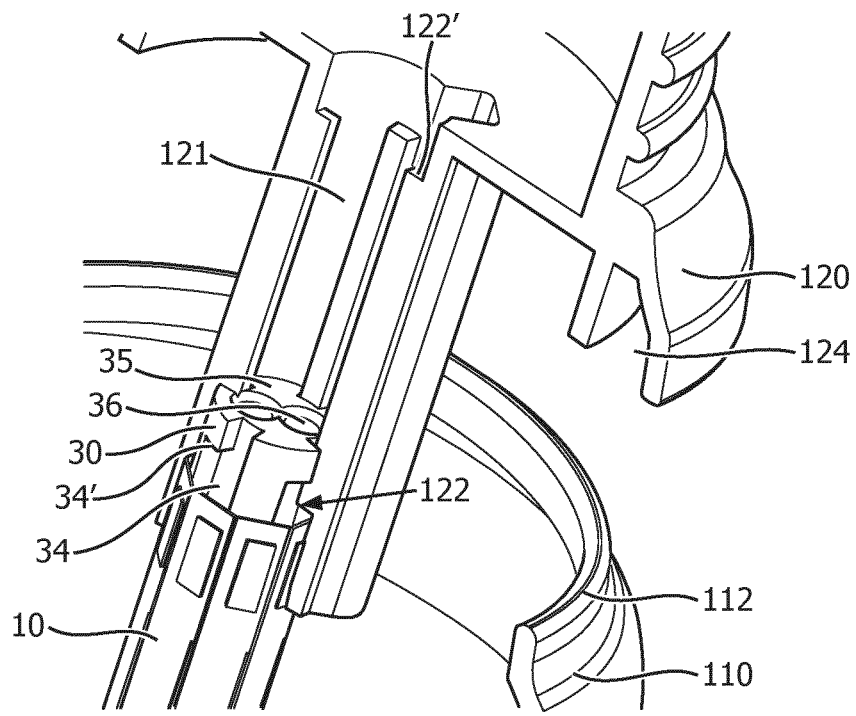
Figure 19:
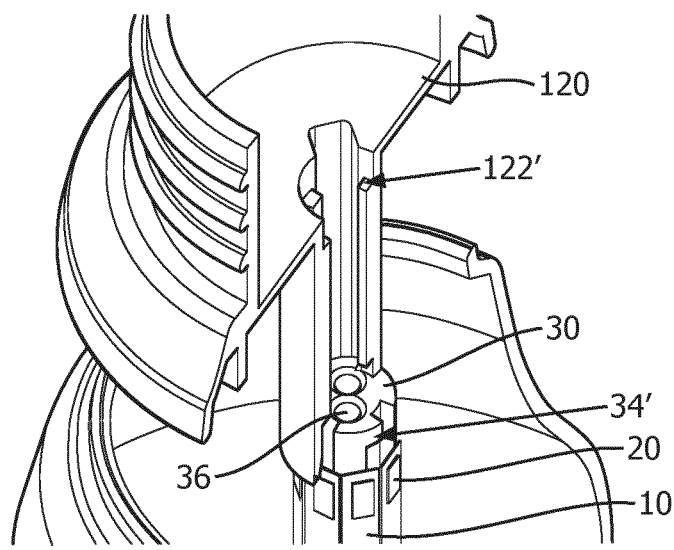
Figure 22:
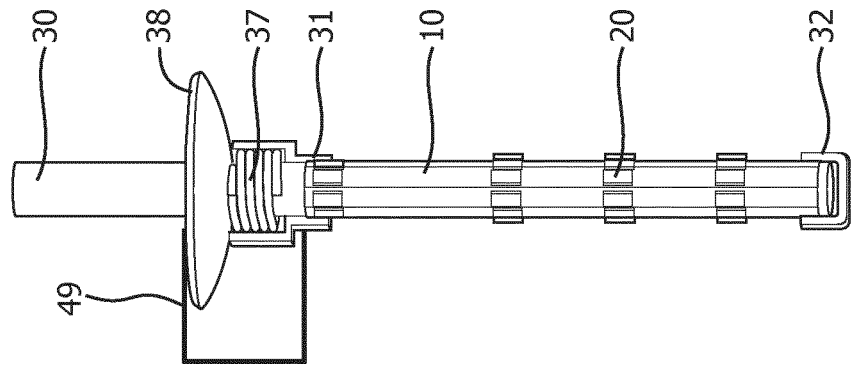
FIGS. 20-26 schematically depict various aspects of a method of manufacturing a luminous arrangement and lighting device according to yet another embodiment.

As can be understood from FIGS. 18 and 19, the flexible carrier 10 may be deformed by pulling the support structure 30, e.g. using the pin 35, into the receiving member 121 of the fitting 120. In order to prevent the flexible carrier 10 from also entering the fitting 120, thereby preventing its deformation, the sidewall of the receiving member 121 may include a shoulder 122, i.e. a stepped profile, that acts as the proximal securing member of the flexible carrier 10. Consequently, when the distal securing member 32 is forced towards the fitting 120 by pulling the support structure 30 up into the receiving member 121 of the fitting 120, the flexible carrier 10 is forced into its deformed shape as the position of the proximal end of the flexible carrier 10 is retained by the shoulder 122.

Alternatively, as shown in FIGS. 16 and 17, the support structure 30 may be long enough to cooperate with the receiving member 121 on the fitting 120, so that the flexible carrier 10 may be deformed by pushing the distal securing member 32 against the inner wall of the transmissive body 110 when inserting the support assembly into the transmissive body 110.

In order to retain the flexible carrier 10 in its deformed shape, it will be necessary to prevent the support structure 30 from sliding back down the receiving member 121. To this end, a locking mechanism may be provided, as shown in FIGS. 18 and 19, in which the main part of the support structure 30 comprises grooves 34 including a shoulder portion 34', with the receiving member 121 of the fitting 120 comprising a further shoulder portion 122'. The locking mechanism may be engaged by rotating the support structure 30 within the receiving member 121, e.g. using the small apertures 36 provided at the proximal end of the support structure 30, thereby aligning the shoulder portions 34' with the further shoulder portions 122' such that a shoulder portion 34' engages with a further shoulder portion 122', thus preventing the downward movement of the support structure 30 in the receiving member 121. Other suitable ways of fixating the support structure 30 in the receiving member 121 will be apparent to the skilled person, e.g. gluing or the like. The fitting 120 may further comprise a recess 124 for engaging with an edge region 112 of the transmissive body 112, as is well-known per se.

At this point, it is noted that the deformation of the flexible carrier 10 may be performed prior to the assembly of the fitting 120 on the transmissive body 110 as well as after such an assembly; it is for instance equally feasible that the pin 35 is accessed through the fitting 120 after assembly of the fitting 120 on to the transmissive body 110.

Figure 20:
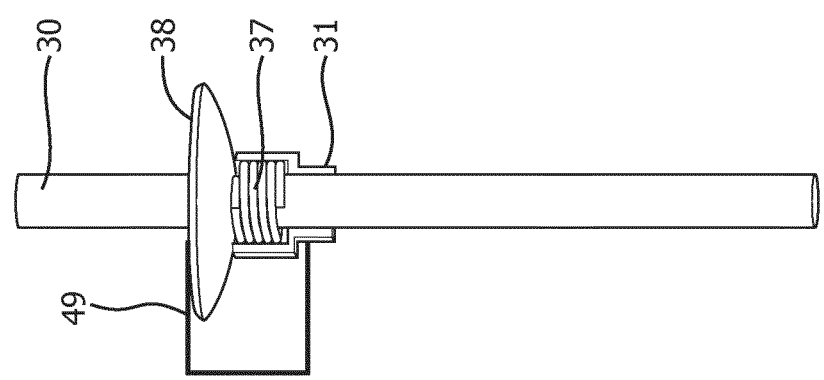
Figure 23:
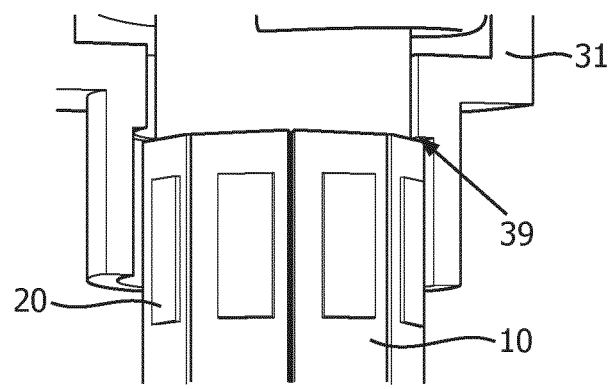

Yet another embodiment of a manufacturing method of a luminous arrangement 10 and lighting device 100 is depicted in FIGS. 20-26, which will be described in more detail below. A flexible carrier 10 carrying SSL elements 20 as previously described in for instance FIGS. 1 and 2 or in FIGS. 6 and 7 and their detailed descriptions may be provided. As shown in FIG. 20, a support structure 30 may be provided, which in this embodiment comprises a hollow tube comprising an integral sealing member 38 shaped and dimensioned to seal off an internal volume of a transmissive body 110 as will be explained in more detail later. A resilient member 37 such as a spring is mounted in a compressed form between the integral sealing member 38 and a proximal securing member 31 that is slidably mounted on the support structure 30, i.e. on the hollow tube. The compressed state of the resilient member 37 is retained by a placeholder 49, e.g. a clamp, clip, or the like secured over the integral sealing member 38 and the proximal securing member 31. The placeholder 49 may be secured in any suitable manner, for instance by using a piece of adhesive tape.

Figure 21:
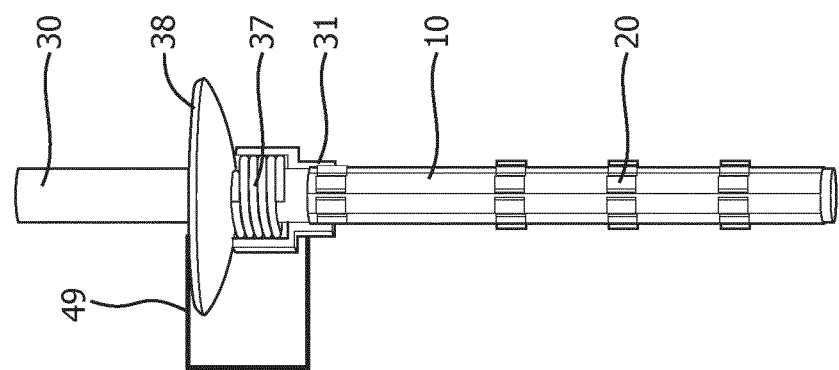

As shown in FIG. 21, the flexible carrier 10 is subsequently mounted on this support structure 30 to form a lighting assembly, after which a distal securing member 32 is mounted at the distal end of the support member 30 in order to immobilize the distal end portion of the flexible carrier 10 on the support structure 30 as previously explained. As shown in more detail in FIG. 23, in an embodiment the proximal securing member 31 may comprise a shoulder 39, i.e. a stepped profile to receive the proximal end portion of the flexible carrier 10, wherein this end portion is secured against the step in this profile of the proximal securing member 31.

Figure 24:
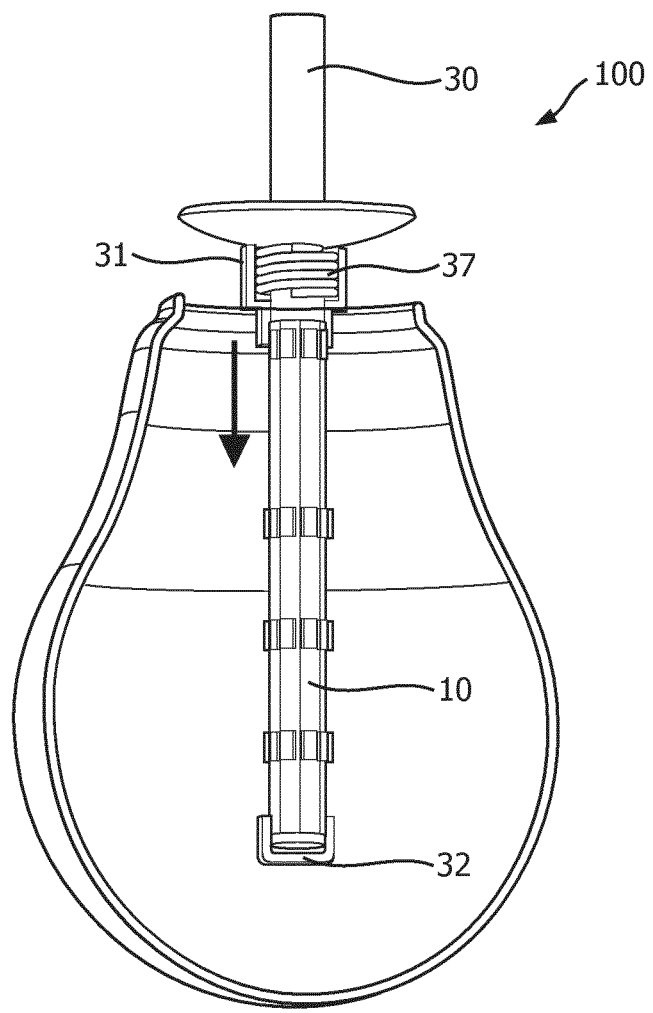

As shown in FIG. 24, the thus formed lighting assembly is placed in a transmissive body 110, which may be made of any of the previously mentioned suitable materials. For reasons that will be explained in more detail below, the support structure 30 including the integral sealing member 38 are preferably made of the same material, such that the sealing member 38 may be fused with an edge region 112 of the transmissive body 110, thereby creating a gas-tight inner volume within the transmissive body 110. For instance, the transmissive body 110 and the support structure 30 may be made of glass or a fusible plastics material.

Figure 25:
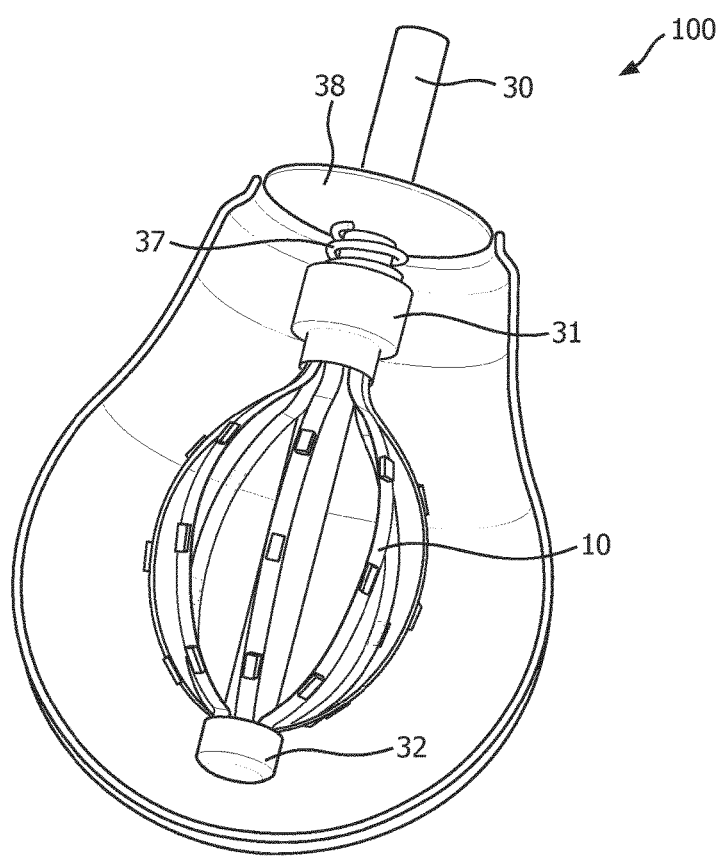

Next, the placeholder 49 is removed from the support structure 30, which allows the resilient member 37 to release its stored energy and expand into a (more) relaxed state. This forces the slidably mounted proximal securing member 31 towards the distal securing member 32 along the hollow tube of the support structure 30, as indicated by the arrow in FIG. 24. Consequently, due to the proximal end portion of the flexible carrier 10 engaging with the shoulder 39 of the proximal securing member 31, the flexible carrier 10 is deformed as previously explained. This is schematically depicted in FIG. 25.

In other embodiments for the purpose of deforming the flexible carrier 10 after or during the insertion of the support structure 30 into the transmissive body 110, an external force may be implemented with a motor, an electromagnet, or other mechanism known by those skilled in the art.

Figure 26:
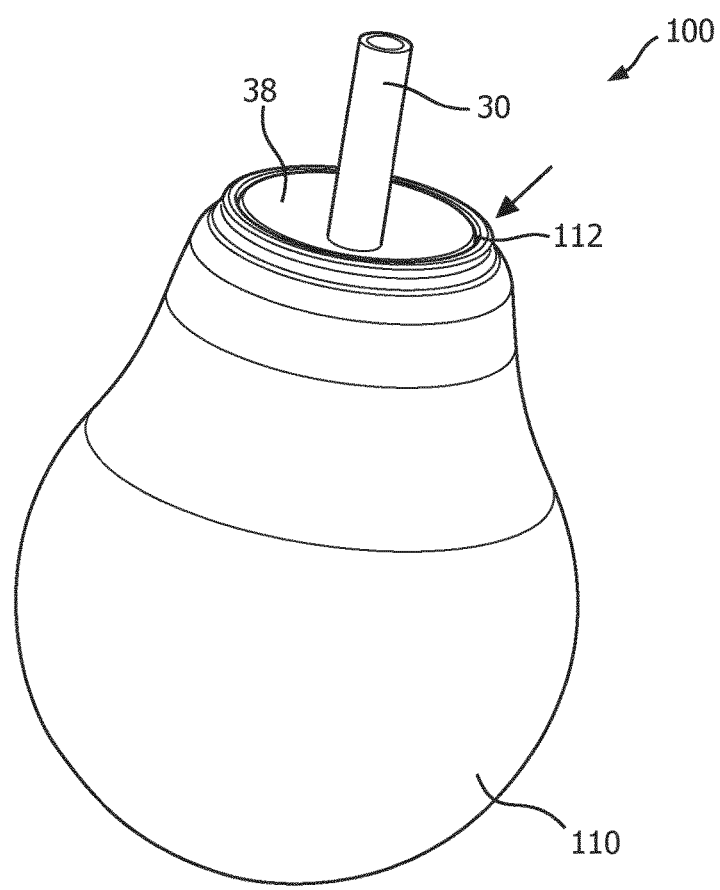

The lighting device 100 may subsequently be finalized by fusing the sealing member 38 with the edge portion 112 of the transmissive body 110 as shown in FIG. 26. The arrow in FIG. 26 highlights this fusing region. This provides a gas-tight inner volume within the transmissive body 110, which may be filled with any suitable gaseous atmosphere through the hollow tube of the support structure 30. Upon filling the gas-tight inner volume with such a gaseous atmosphere, the hollow tube may be sealed in any suitable gas-tight manner. As filling a gas-tight transmissive body with a desired gas or gas mixture is well-known per se, this will not be explained in further detail for the sake of brevity only.

In the above embodiments, the lighting device 100 is depicted as a light bulb. It should however be understood that the present invention is not limited to such an embodiment of the lighting device 100; the lighting device 100 may take any suitable form, in particular any form for which an incandescent alternative is available.

A lighting device 100 according to any of the aforementioned embodiments may be advantageously integrated into a luminaire to provide a cost-effective luminaire benefiting from being able to produce a luminous output closely resembling the luminous output of an incandescent lighting device. Any suitable type of luminaire may be contemplated, such as a ceiling down lighter, an armature, a freestanding luminaire, an electronic device including a lighting device, e.g. a cooker hood, fridge, microwave oven, and so on.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A lighting device comprising a transmissive body housing a luminous arrangement, and a fitting cooperating with the transmissive housing, said luminous arrangement comprising a single piece flexible carrier mounted on a support structure, wherein the support structure is mounted inside the fitting to form a support assembly; the flexible carrier comprising:
   a first tubular end portion enveloping a first region of the support structure;
   a second tubular end portion enveloping a second region of the support structure, the first region being spatially separated from the second region axially; and
   a plurality of strip-shaped portions formed by a plurality of incisions in a central section of the flexible carrier, the strip-shaped portions axially extending from the first tubular end portion to the second tubular end portion, each of said strip-shaped portions carrying a plurality of solid state lighting elements;
   wherein the central section is mounted on the support structure in a rolled state and has a parallelogram shape in an unrolled state, and the incisions extend in parallel with a side edge of the parallelogram shape such that each of the strip-shaped portions spirals from the first tubular end portion to the second tubular end portion when the flexible carrier is in the rolled state; and
   wherein the support assembly comprises a sub-assembly configured to exert an axial force that biases the first tubular end portion and the second tubular end portion axially together, such that the strip-shaped portions are forced to radially extend between the first tubular end portion and the second tubular end portion, after or during mounting the support assembly into the transmissive housing.

2. The lighting device of claim 1, wherein the sub-assembly comprises a resilient member, a motor, or an electromagnet.

3. The lighting device of any of claim 1, wherein different strip-like portions have different distributions of solid state lighting elements.

4. The lighting device of claim 1, further comprising at least one driver circuit for driving the solid state lighting elements, wherein:
   the solid state lighting elements on said strip-shaped portions are connected in series with said at least one driver circuit; or
   the solid state lighting elements on different strip-shaped portions are connected in parallel with said at least one driver circuit.

5. The lighting device of claim 1, wherein the support structure comprises a proximal securing member slidably mounted on the support structure.

6. A luminaire comprising the lighting device of claim 1.

7. A method of manufacturing a lighting device, the method comprising:
   manufacturing a luminous arrangement by:
   providing a sheet of a flexible carrier;
   making a plurality of incisions to define a plurality of strip-shaped portions in the flexible carrier, each incision extending between: a first edge of a first terminal portion of the flexible carrier delimited by said first edge and an opposing second edge; and a first further edge of a second terminal portion of the flexible carrier delimited by said first further edge and a second further edge opposite the first further edge, such that the plurality of strip-shaped portions extend between said first terminal portion and said second terminal portion;
   mounting solid state lighting elements on each of the strip-shaped portions; and
   rolling the flexible carrier into a tubular shape, wherein the first terminal portion defines a first tubular end portion and the second terminal portion defines a second tubular end portion;
   mounting the luminous arrangement on a support structure such that the first tubular end portion envelopes a first region of the support structure and the second tubular end portion envelopes a second region of the support structure, the first region being spatially separated from the second region;
   providing a transmissive housing and a fitting for cooperating with the transmissive housing;
   mounting the support structure inside the fitting to form a support assembly;
   mounting the support assembly into the transmissive housing such that the luminous arrangement is enclosed by the transmissive housing; and
   exerting an axial force to bias the first tubular end portion and the second tubular end portion axially together such that the strip-shaped portions are forced to radially extend between the first tubular end portion and the second tubular end portion after or during mounting the support assembly into the transmissive housing;
   wherein at least a central section of the flexible carrier has a parallelogram shape and wherein said incisions extend in parallel with a side edge of said parallelogram shape.

8. The method of claim 7, wherein the support structure comprises:
   a distal securing member;
   a main body coupled to the distal securing member;
   an annular recess in the distal securing member and delimited by the main body, a distal end portion of the flexible carrier being secured in said annular recess; and a protrusion extending from the main body opposite said distal securing member, wherein:

the step of forcing the first tubular end portion towards the second tubular end portion such that the strip-shaped portions are forced to radially extend between the first tubular end portion and the second tubular end portion comprises:

using the protrusion to pull the main body into the fitting whilst retaining a proximal end portion of the flexible carrier, thereby forcing the distal end portion and the proximal end portion of the flexible carrier towards each other; or during the step of mounting the support assembly into the transmissive housing on the fitting such that the luminous arrangement is enclosed by the transmissive housing, pushing the distal securing member against an inner wall of the transmissive housing, thereby forcing the distal end portion and the proximal end portion of the flexible carrier towards each other.

9. The method of claim 8, wherein the step of providing said fitting comprises providing a fitting including a receiving member for receiving the proximal end of the support structure, said receiving member including a stepped inner wall profile for immobilizing the proximal end portion of the flexible carrier during said pushing step.

10. The method of claim 7, wherein the support structure is mounted inside the fitting to form a support assembly, wherein the support assembly further comprised a motor, or an electromagnet, which forces the first tubular end portion towards the second tubular end portion, such that the strip-shaped portions are forced to radially extend between the first tubular end portion and the second tubular end portion, after or during mounting the support assembly into the transmissive housing.

11. The method of claim 7, wherein the support structure comprises:

a hollow tubular body;

a sealing member integral to the hollow tubular body and dimensioned to seal off the transmissive housing;

a resilient member compressed against the sealing member; and a proximal securing member slidably fitted around the support structure such that the resilient member is clamped in between the sealing member and the proximal securing member; and wherein:

the step of forcing the first tubular end portion towards the second tubular end portion is performed after mounting the support assembly into the transmissive housing; and the step of forcing the first tubular end portion towards the second tubular end portion such that the strip-shaped portions are forced to radially extend between the first tubular end portion and the second tubular end portion comprises releasing said resilient member such that the proximal securing member is forced towards a distal end of the support structure.

12. The method of claim 11, further comprising fusing the sealing member with an edge portion of the transmissive housing to form a gas-tight inner volume within the transmissive housing.

* * * * *